United States Patent [19]

Nagano

[11] Patent Number: 4,565,962

[45] Date of Patent: Jan. 21, 1986

[54] GYRATOR

[75] Inventor: Katsumi Nagano, Shimonoseki, Japan

[73] Assignee: Kabushiki Kaisha Toshiba, Japan

[21] Appl. No.: 632,858

[22] Filed: Jul. 20, 1984

[30] Foreign Application Priority Data

Jul. 29, 1983 [JP] Japan .................................. 58-138816

[51] Int. Cl.$^4$ ........................... G05F 1/00; H03H 7/44
[52] U.S. Cl. ..................................... 323/351; 323/902; 333/215
[58] Field of Search ............... 323/315, 317, 902, 350, 323/351; 307/31; 333/215

[56] References Cited

U.S. PATENT DOCUMENTS

| | | | |
|---|---|---|---|
| 3,452,304 | 6/1969 | Mitra | 333/215 |
| 3,497,836 | 2/1970 | Daniels | 333/215 |
| 3,500,262 | 3/1970 | Daniels | 333/215 |
| 3,501,716 | 3/1970 | Ferch et al. | 333/215 |
| 3,513,401 | 5/1970 | Tokunaga | 333/215 |

OTHER PUBLICATIONS

Voorman et al., "An Electronic Gyrator," IEEE Journal of Solid-State Circuits, vol. SC-7, No. 6, pp. 469–474, Dec. 1972.

*Primary Examiner*—Peter S. Wong
*Assistant Examiner*—Judson H. Jones
*Attorney, Agent, or Firm*—Finnegan, Henderson, Farabow, Garrett & Dunner

[57] ABSTRACT

A gyrator is comprised of a first voltage-current converter for converting the first voltage applied to a first terminal into electric current, a first light-emitting diode for converting the output current of the first voltage-current converter into a corresponding photosignal, a first phototransistor optically connected to the first light-emitting diode, the transistor converting the photosignal from the first light-emitting diode into a corresponding current, the transistor further supplying the converted current to a load capacitor connected to a second terminal, a second voltage-current converter for converting voltage, which is caused at the second terminal by the load capacitor, into a corresponding electric current, second light-emitting diode for converting the output current of the second voltage-current converter into a corresponding photosignal, second phototransistor optically connected to the second light-emitting diode, and for converting the photosignal from the second light-emitting diode into a corresponding electric current, and means for supplying the converted electric current from the phototransistor to the first terminal.

7 Claims, 10 Drawing Figures

F I G. 2
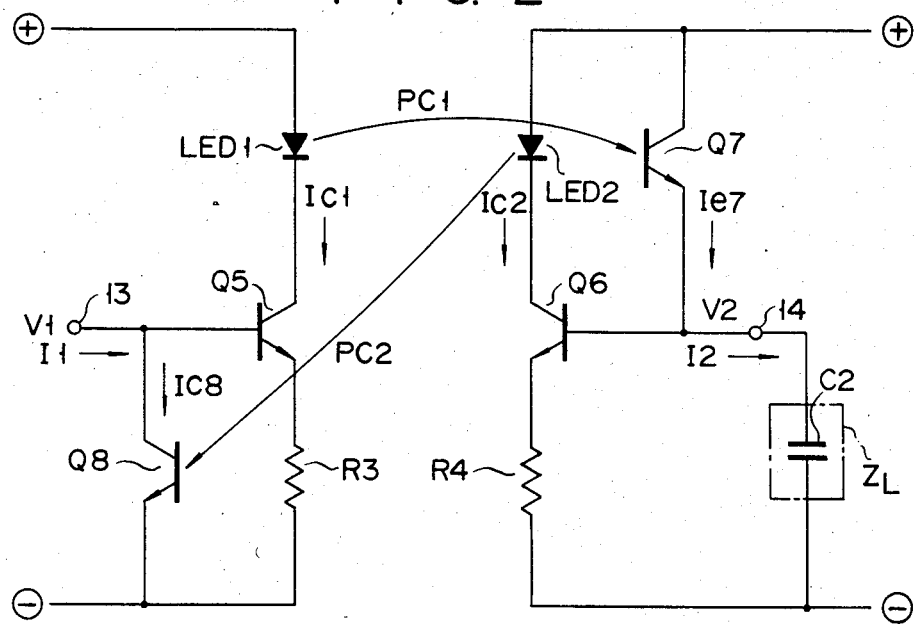

F I G. 3A
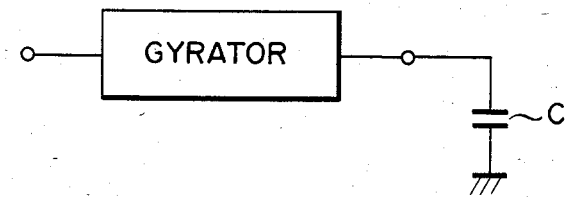
F I G. 3B
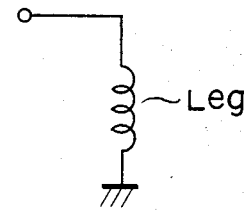
F I G. 4
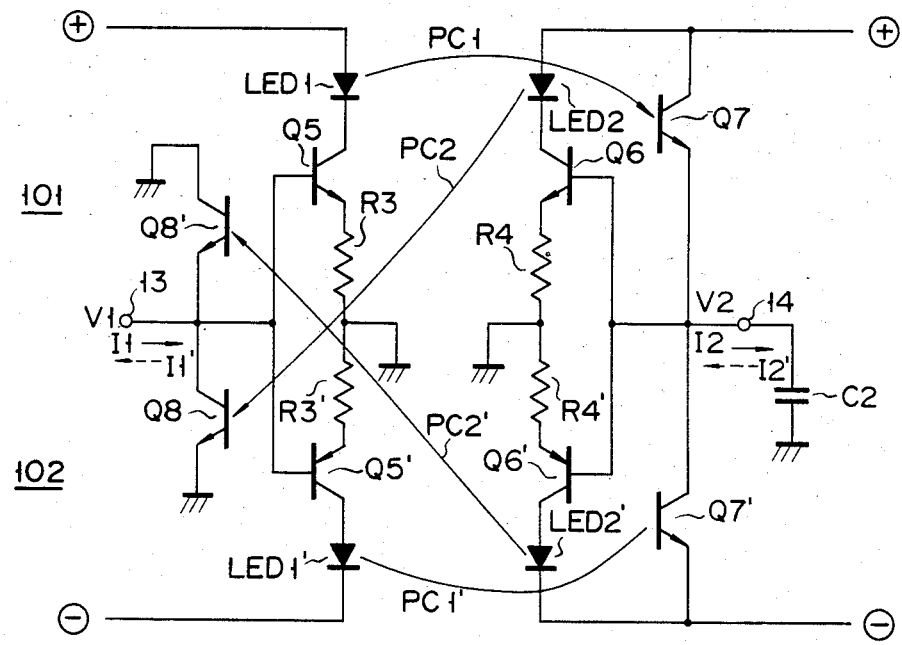

4,565,962

GYRATOR

BACKGROUND OF THE INVENTION

The present invention relates to a gyrator for converting an inductive load into an apparent capacitive load.

The gyrator is discussed in the following articles: (1) The Gyrator, A New Electric Network Element by B. D. H. Tellegen, Phillips Research Reports, Vol. 3, pp. 81–101, 1948, and in (2) An Electronic Gyrator, by H. O. Voorman et al, IEEE Journal of Solid-State Circuits, Vol. SC-7, pp. 469–474, Dec. 1972.

The gyrator discussed in the second article is illustrated in FIG. 1 in the form of an equivalent circuit. As shown, a couple of voltage-current converter circuits are contained in the gyrator. A couple of PNP transistors Q1 and Q2 and a resistor R1 make up a first voltage-current converter. A couple of NPN transistors Q3 and Q4 and a resistor R2 make up a second voltage-current converter. The bases of the PNP transistors Q1 and Q2 are coupled with input and output terminals 11 and 12, respectively. The resistor R1 connects the emitters of the transistors Q1 and Q2. The collectors Q1 and Q2 are connected to the bases of the NPN transistors Q4 and Q3, respectively. The resistor R2 connects the emitters of the transistors Q3 and Q4. A capacitor C1 is connected between the bases of the transist Q3 and Q4.

In operation, a potential difference v between the bases of the transistors Q1 and Q2 causes a voltage v' to appear across the resistor R1. If the base-emitter voltage $V_{BE}$ of those transistors is negligible, v is nearly equal to v'. Current i, caused to flow through the resistor R1 by the voltage v', has the flow direction as indicated by an arrow. With this current i, the capacitor C1 is charged up to voltage Vc. The voltage Vc renders the transistors Q3 and Q4 conductive. The voltage Vc causes current $i_c$ to flow through the resistor R2 in the direction of the arrow. Thus, this circuit operates as a gyrator for converting a capacitve load into an inductive load.

The above gyrator suffers from some restrictions in use and hence in its application. For example, the voltages applied to the input and output terminals must be in phase. The input voltage must be AC. Widening of the input voltage range is accompanied by circuit complexity. One of the possible approaches to widen the input voltage range is to connect a current mirror circuit to the collectors of the transistors Q1 and Q2. The measure still involves problems to be solved. The first is the circuit's complexity. The second is that the operating range of the current mirror circuit is limited within the power source voltage.

This type of gyrator has an attractive application in that the cascade connection of two gyrators provides an equivalent transformer. However, the application is also unsatisfactory since the input and output circuits of the combined gyrators are inseparable from each other.

SUMMARY OF THE INVENTION

Accordingly, an object of the present invention is to provide a gyrator advantageously featured in that an input voltage is widely variable; the input and output circuits thereof are separable; and the circuit construction is free from the problem of complexity.

According to the invention, there is provided a gyrator comprising:

a first terminal to be coupled with first voltage;
a second terminal to be coupled with second voltage;
load means connected to said second terminal;
first voltage-current converting means for converting said first voltage applied to said first terminal into electric current;
first electro-photo converting means for converting the output current of said first voltage-current converting means into a corresponding photosignal;
first photo-electric converting means optically connected to said first electro-photo converter, for converting the photosignal, which is produced from said first electro-photo converting means, into a corresponding current, said means supplying the converted current to said load means connected to said second terminal;
second voltage-current converting means for converting voltage, which is caused at said second terminal by said load means, into a corresponding electric current;
second electro-photo converting means for converting the output current of said second voltage-current converting means into a corresponding photosignal;
second photo-electric converting means optically connected to said second electro-photo converting means, said second photo-electric converting means converting the photosignal from said second electro-photo converting means into a corresponding electric current; and
means for supplying the converted electric current from said second photo-electric converting means to said first terminal.

BRIEF DESCRIPTION OF THE DRAWINGS

FIG. 2 shows a circuit diagram of an embodiment of a gyrator according to the present invention;
FIG. 3A shows an equivalent circuit of the FIG. 2 circuit,
and FIG. 3B shows an equivalent circuit of the load of the FIG. 2 circuit;
FIG. 4 is a circuit diagram showing another embodiment of a gyrator according to the present invention.

DETAILED DESCRIPTION OF THE PREFERRED EMBODIMENTS

Figure 1:
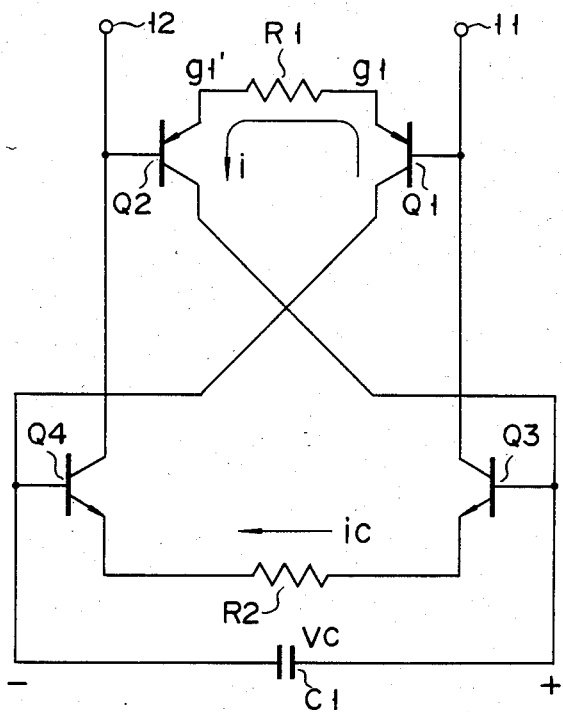
FIG. 1 shows an equivalent circuit of a prior gyrator.

Some specfic embodiments of the present invention will be described referring to the accompanying drawings.

Reference is first made to FIG. 2 illustrating a gyrator of a first embodiment of the present invention. In FIG. 2, an NPN transistor Q5 and a resistor R3 make up a first voltage-current converter. An NPN transistor Q6 and a resistor R4 likewise make up a second voltage-current converter. An input terminal of the gyrator is coupled with the base of the transistor Q5, while an output terminal is coupled to the base of the transistor Q6. The collectors of the transistors Q5 and Q6 are respectively connected to a positive (+) power source, through respectively first and second light-emitting diodes LED1 and LED2 as electro-photoconnecting elements. The emitters of transistors R3 and R4 are connected to a negative (−) power source voltage, through respectively the resistors R3 and R4. A phototransistor Q7 as a first photo-electro converting element is placed between the output terminal 14 and the positive power source. The photodiode Q7 is optically coupled with the diode LED1. The diode LED1 and the transistor Q7 make up a first photocoupler PC1. A phototransistor Q8 is placed between the input terminal 13 and the negative power source, and is optically coupled with the photodiode LED2. The transistor Q8 and the diode LED2 make up a second photocoupler PC2. A capacitor as a load having load impedance $Z_L$ is inserted between the output terminal and the negative power source.

The operation of the gyrator thus arranged will be given.

The collector currents Ic1 and Ic2 of the transistors Q5 and Q6 are respectively given by:

$$Ic1 = (V1 - V_{BE})/R3 \approx V1/R3 \quad (1)$$

$$Ic2 = (V2 - V_{BE})/R4 \approx V2/R4 \quad (2)$$

where V1 and V2 are voltages applied to the input and output terminals 13 and 14, respectively, and I1 and I2 are currents flowing into and out of these terminals, respectively. In the above relations, if the base-emitter voltage $V_{BE}$ of each of the transistors is neglected, it is clearly seen that the collector currents Ic1 and Ic2 are proportional to the voltages V1 and V2, respectively. This fact indicates that the FIG. 2 circuit operates as a voltage-current converter.

If the current transfer ratios of the photocouplers PC1 and PC2 are K1 and K2, respectively, the emitter current Ie7 of the transistor Q7 and the collector current Ic8 of the transistor Q8 are expressed by:

$$Ie7 = K1 \times Ic1$$

$$Ic8 = K2 \times Ic2$$

The currents I1 and I2 of the input and output terminals 13 and 14 are respectively expressed by:

$$I1 = K2 \times Ic2 = K2 (V2/R4) \quad (3)$$

$$I2 = K1 \times Ic1 = K1 (V1/R3) \quad (4)$$

In the above equations, the base currents of the transistors Q5 and Q6 are neglected.

The voltage V2 at the output terminal 14 is:

$$V2 = Z_L \times I2 \quad (5)$$

An input impedance Zin of the gyrator under discussion is:

$$Zin = V1/I1$$

Substituting the equations (3) and (4), we have:

$$Zin = \frac{V1}{I1} = \frac{R3 \cdot R4}{K1 \cdot K2} \times \frac{I2}{V2}$$

Then, using the equation (5), we obtain:

$$Zin = \frac{R3 \cdot R4}{K1 \cdot K2} \times \frac{1}{Z_L} \quad (6)$$

Equation (6) shows that the input impedance Zin is inversely proportional to the output impedance $Z_L$. This characteristic indicates a basic operation of the gyrator. In this respect, the gyrator is also called an impedance converter.

The load impedance when the load contains only the capacitor, for example, C2, is:

$$Z_L = \frac{1}{j\omega C2} \quad (j = \sqrt{-1}) \quad (7)$$

Substituting equation (7) into equation (6), we have:

$$Zin = \frac{R3 \cdot R4}{K1 \cdot K2} \cdot j\omega C2 \quad (8)$$

$$= j\omega Leg$$

where $$Leg = \frac{R3 \cdot R4}{K1 \cdot K2} C2$$

as an inductive impedance. Equation (8) indicates that the input impedance Zin is equal to the inductive impedance Leg. This is illustrated in FIGS. 3A and 3B. FIG. 3A shows that the FIG. 2 circuit operates as a gyrator. FIG. 3B is an equivalent circuit of the load of the FIG. 2 circuit. It is impractical to manufacture a large coil for a large inductive element, from an economical and space saving standpoint. The gyrator with a capacitor as a load element may be used in place of such a large coil.

FIG. 4 shows a gyrator which is another embodiment of the present invention. In the FIG. 2 embodiment, the current flow is unidirectional, that is, current flows from the input terminal to the output terminal. On the other hand, in the FIG. 4 circuit the current flow is bidirectional. The circuit of FIG. 4 is so arranged that a couple of the FIG. 2 circuits are symmetrically coupled with respect to the ground. It is evident that the reference potential is not limited to ground potential, but may be set at a proper potential. In this circuit, the negative power source in FIG. 2 is replaced by the ground, and an additional gyrator circuit is inserted between the negative power source and the ground. In the additional circuit, current flows from the ground to the negative power source. In this circuit, like symbols are used for designating like portions in FIG. 2, and like but primed symbols are used for designating those corresponding portions in the additional circuit. The explanation will be given of only the additional or modified portions.

In the FIG. 4 circuit, the emitter of the transistor Q8 is grounded. The emitters of the transistors Q5 and Q6 are also grounded through the resistors R3 and R4. The capacitor C2 is inserted between the output terminal 14 and the ground.

A transistor Q8' corresponds to the transistor Q8; the resistor R3' corresponds to that of R3; the diode LED1' corresponds to the diode LED1; the transistor Q7' corresponds to that of Q7; the resistor R4' corresponds to that of R4; and the diode LED2' corresponds to the diode LED2. The diode LED1' and the transistor Q7' form a photocoupler PC1'; the diode LED2' and the transistor Q8' form another photocoupler PC2'. During negative half cycles of the voltage V1, the circuit 102 operates, and currents I1' currents I1' and I2' flow through the circuit in the direction of the arrow as indicated by the broken lines. The current I2' flows into the circuit from the output terminal 14, and the current I1' flows out of the circuit through the input terminal 13. During the positive half cycles of the voltage V1, currents I1 and I2 flow in the direction of the arrow as indicated by the solid lines.

In this way, a bidirectional current flow is allowed in this circuit. In other words, the FIG. 4 circuit is operable with AC input. Therefore, the load capacitor can almost perfectly be charged and discharged.

Figure 5:
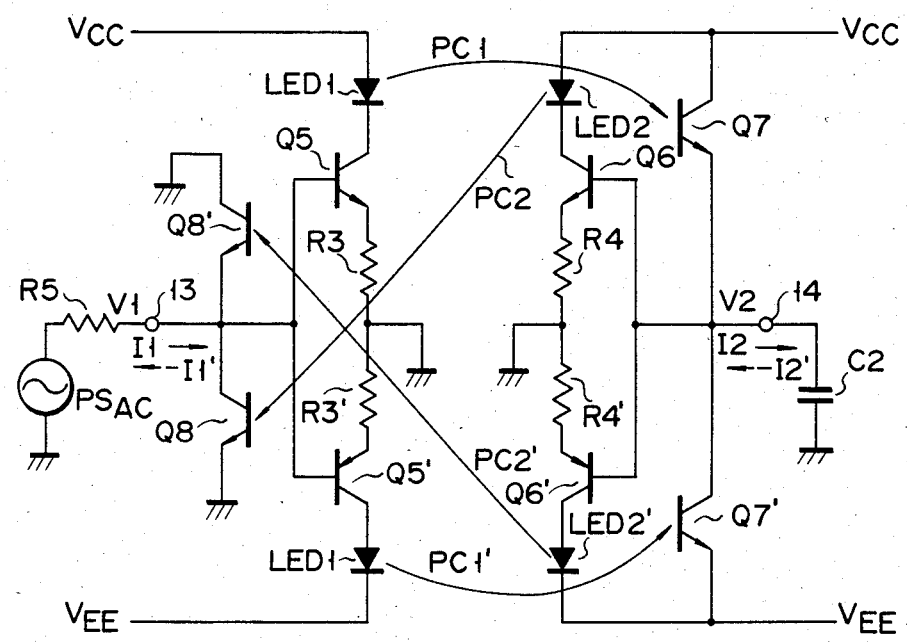
FIG. 5 is a circuit diagram of the gyrator of FIG. 4 which is experimentally constructed.
Figure 6A:
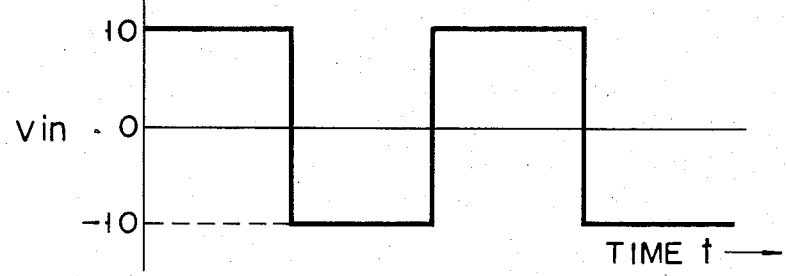
FIG. 6A shows a waveform of a power source voltage of a power source used in the FIG. 5 circuit.

FIG. 5 shows an experimental circuit of a gyrator according to the present invention. This test circuit is equivalent to an RL differential circuit, with the connection of a resistor R5 to the input terminal 13 in the FIG. 4 circuit. An AC power source $PS_{AC}$ is inserted between the resistor R5 and the ground. An input voltage Vin applied to the input terminal 13 is a pulsative voltage pulsating between ±10 V, as shown in FIG. 6A. $V_{CC}$ is used for the positive power source, while $V_{EE}$ is used for the negative power source.

Figure 6B:
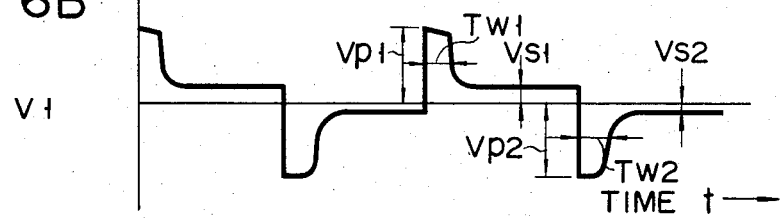
FIG. 6B shows a waveform of a signal at the input terminal of the FIG. 5 circuit when the circuit is applied with the power voltage with the waveform shown in FIG. 6A.

In this circuit, $V_{CC}=15$ V; $V_{EE}=-15$ V; R3, R3', R4, R4', and R5 are each equal to 1 kilo ohms; and C2=0.1 uF. The voltage V1 at the input terminal takes the waveform as shown in FIG. 6B when the voltage of FIG. 6A was applied to the circuit.

Assuming that the pulse widths at the midpoints of the positive and negative amplitudes of the input voltage V1 are Tw1 and Tw2, respectively, the inductive impedance Leg can theoretically be obtained using equation (8). Putting the above values of the resistors R3 and R3 and the capacitor C2 into equation (8), we have:

$$Leg \approx \frac{10^3 \times 10^3}{1 \times 1} \times 0.1 \times 10^{-6}$$

$$= 0.1\ H$$

Time constant $\tau$ of this circuit is:

$$\tau = Leg/R5 = 0.1/(1 \times 1000) = 0.1\ msec$$

The positive and negative amplitudes Vp1 and Vp2 of the input voltage V1 are Vp1=7.5 V and Vp2=−8.0 V. The amplitudes Vs1 and Vs2 of the positive and negative stationary portions of the voltage V1 are 0.9 V and −1.0 V, respectively. The pulse widths Pw1 and Pw2 at the midpoints of the amplitudes Vp1 and Vp2 are 0.1 msec and 0.15 msec, respectively.

The time constant $\tau = 0.1$ msec, which is theoretically obtained, is exactly equal to the pulse width Tw1=0.1 msec and Tw2=0.15 msec, which were experimentally obtained. Thus, the experimental results show that the experimental circuit with the 0.1 uF capacitance operates as an inductive element of 0.1 H.

Figure 7:
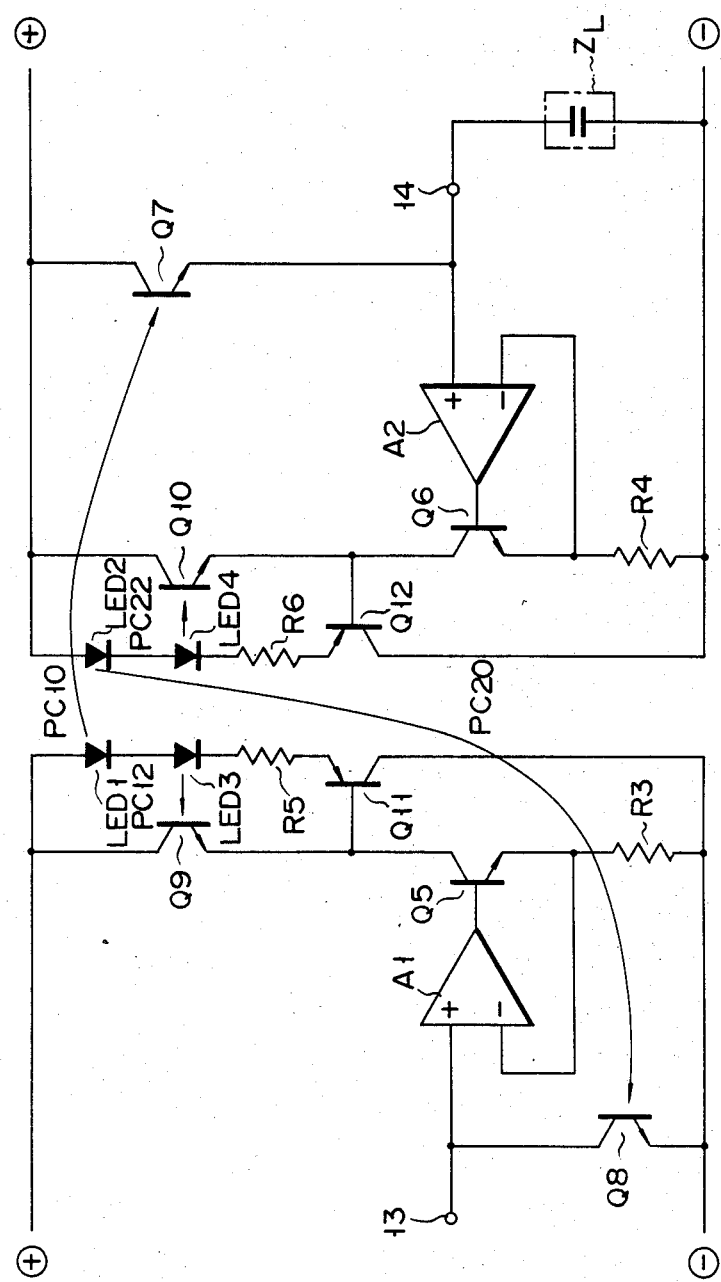
FIGS. 7 and 8 are respectively circuit diagrams of gyrators which are further embodiments of the present invention.

Turning now to FIG. 7, there is shown another embodiment of a gyrator according to the present invention. This embodiment is featured by linearizing the current transfer characteristic of the photocoupler. The above-mentioned embodiments of FIGS. 2, 4 and 5 have been described on the assumption that the current transfer ratios K1 and K2 of the photocouplers PC1, PC1', PC2 and PC2' are K1=1 and K2=1, that is, those photocouplers each have a linear current transfer ratio. Actually, however, the photocoupler does not exhibit a stable and linear current transfer characteristic over an entire range of current. In a small current region, it exhibits a square law characteristic, while, in a large current region, it exhibits a linear characteristic.

To improve the nonlinear current transfer characteristic, the FIG. 7 embodiment additionally uses light emission diodes LED3 and LED4, phototransistors Q9 and Q10 optically connected respectively to these diodes, resistors R5 and R6, and PNP transistors Q11 and Q12. This embodiment further uses operational amplifiers A1 and A2 for making the emitter voltages of the transistors Q5 and Q6 respectively equal to the input voltages V1 and V2. The provision of these amplifiers improves the converting accuracy of the voltage-current converter.

In the present embodiment, the input terminal 13 is connected to the noninverting input terminal of the operational amplifier A1. The output terminal of the amplifier A1 is connected to the base of the transistor Q5. The collector of the transistor Q5 is connected to the base of the transistor Q11 and to the positive power source via the emitter-collector path of the transistor Q9. The emitter of the transistor Q5 is connected to the inverting input terminal of the amplifier A1, and to the negative power source via the resistor R3. The emitter of the transistor Q11 is connected to the positive power source, through the resistor R5 and the diodes LED3 and LED1 which are connected in series. The collector of the transistor Q11 is connected to the negative power source. The diode LED3 is connected at the anode to the positive power source through the diode LED1, and at the cathode to the emitter of the transistor Q11, through the resistor R. The diode LED3 and the transistor Q9 cooperate to form a photocoupler PC12.

The output terminal 14 is connected to the noninverting input terminal of the operational amplifier A2. The output terminal of the operational amplifier A2 is coupled with the base of the transistor Q6. The collector of the transistor Q6 is connected to the base of the transistor Q12, and to the positive power source via the emitter-collector path of the phototransistor Q10. The emitter of the transistor Q6 is connected to the inverting input terminal of the amplifier A2, and to the negative power source via the resistor R4. The emitter of the transistor Q12 is connected to the positive power source, through the resistor R6 and the diodes LED4 and LED2 in this order. The collector of the transistor Q12 is connected to the negative power source. The LED4 is connected at the anode to the positive power source through the LED 2, and at the cathode to the emitter of the transistor Q12. The diode LED4 and the phototransistor Q10 form a photocoupler PC12.

Connected between the input terminal 13 and the negative power source is a phototransistor Q8 optically connected to the diode LED2. The phototransistor Q8, together with the LED2, forms a photocoupler PC20. Connected between the output terminal 14 and the positive power source is a phototransistor Q7 optically coupled with a phototransistor Q7. The transistor Q7, together with the diode LED1, forms a photocoupler PC10. A load impedance element $Z_L$ is connected between the output terminal 14 and the negative power source.

In the embodiment of FIG. 7, to obtain a linear current transfer characteristic over substantially the entire current range, it is necessary to make the current transfer coefficient K1 of the photocoupler PC10 to that K2 of the photocoupler PC12, and to make the current transfer coefficient K2 of the photocoupler PC20 to that K22 of the photocoupler PC22. Under this condition, the currents flowing through the transistors Q7 and Q9 are equal to each other.

Figure 8:
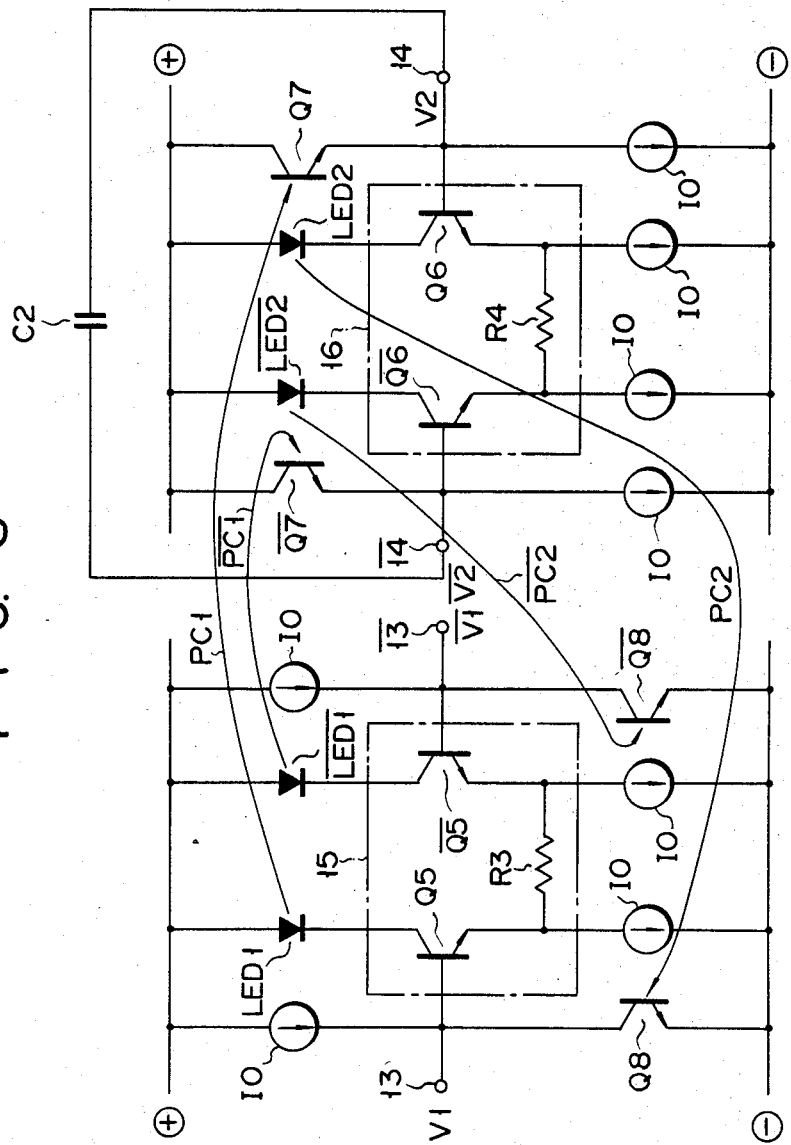

FIG. 8 shows yet another embodiment of a gyrator of the present invention. While the above-mentioned embodiment is of the grounded impedance type, this embodiment is of the floating type, lessening constraints in the application. To this end, this embodiment employs differential input arrangements. As shown in FIG. 8, the FIG. 8 embodiment is comprised of a couple of voltage-current inverters 15 and 16, and four photocouplers PC1, PC1, PC2 and PC2. In FIG. 8, like reference numerals are used to designate like portions in FIG. 2. In each differential arrangement, the components in each pair are designated by like symbols, one of the paired components having the upper bar. For example, the diode LED1 and the transistor Q5 are used for the diode LED1 and the transistor Q5; the transistor Q8 is used for the transistor Q8; the diode LED2 and the transistor Q6 are used for the diode LED2 and the transistor Q6; the transistor Q7 is used for the transistor Q7; the input terminal 13 is used for the input terminal 13; and the output terminal 14 is used for the output terminal 14. The diode LED1 and the transistor Q7 provide a photocoupler PC1. The diode LED2 and Q8 provide a photocoupler PC2.

As shown, the resistor R3 is connected between the emitters of the NPN transistors Q5 and Q5. The transistor Q5, together with the transistor Q5 and the resistor R3, forms a differential type voltage-current converter. The resistor R4 is connected between the emitters of the NPN transistors Q6 and Q6. The transistor Q6, together with the transistor Q6 and the resistor R4, forms a voltage-current converter. Current sources $I_O$ are respectively provided in the series circuits, which are respectively inserted between the positive and negative power sources. The current source is provided for cancelling the bias current in the voltage-current converter. The load capacitor C2 is coupled between the output terminals 14 and 14. The remaining circuit arrangement in the present embodiment is substantially the same as that of the FIG. 2 embodiment. In the FIG. 8 embodiment, the load capacitor C2 provides an equivalent inductive impedance Leg between the input terminals 13 and 13.

As seen from the foregoing description, according to the present invention, an input voltage is variable over a wide range. Further, since the input and output are separable from each other, the gyrator according to the present invention has a variety of applications.

It is evident that the conductivity type of the transistor may be replaced from NPN to PNP. The positive and negative polarities of the power sources are also interchangeable.

It should be understood that the present invention may variously be changed and modified within the scope of the present invention.

What is claimed is:

1. A gyrator comprising:
    a first terminal to be coupled with first voltage;
    a second terminal to be coupled with second voltage;
    load means connected to said second terminal;
    first voltage-current converting means for converting said first voltage applied to said first terminal into electric current;
    first electro-photo converting means for converting the output current of said first voltage-current converting means into a corresponding photosignal;
    first photo-electric converting means optically connected to said first electro-photo converter, for converting the photosignal, which is produced from said first electro-photo converting means, into a corresponding current, said means supplying the converted current to said load means connected to said second terminal;
    second voltage-current converting means for converting voltage, which is caused at said second terminal by said load means, into a corresponding electric current;
    second electro-photo converting means for converting the output current of said second voltage-current converting means into a corresponding photosignal;
    second photo-electric converting means optically connected to said second electro-photo converting means, said second photo-electric converting means converting the photosignal from said second electro-photo converting means into a corresponding electric current; and
    means for supplying the converted electric current from said second photo-electric converting means to said first terminal.

2. A gyrator according to claim 1, further comprising a circuit section which is substantially equal to the whole circuit as set forth in claim 1, the couple of said circuit sections being provided between first and second power sources with respect to the reference potential.

3. A gyrator according to claim 2, in which said reference potential is a ground potential, and said first and second power sources are respectively positive and negative power sources.

4. A gyrator according to claim 1, further comprising photocoupler means with a current transfer coefficient substantially equal to that of photocoupler means including said first electro-photo converting means and said first photo-electric converting means, and another photocoupler means with a current transfer coefficient substantially equal to that of photocoupler means including said second electro-photo converting means and said second photocoupler.

5. A gyrator according to claim 1, in which said first and second voltage-current converting means are both of the differential type.

6. A gyrator according to claim 1, in which said first and second electro-photo converting means are respectively light-emitting diodes.

7. A gyrator according to claim 1, in which said first and second photo-electric converting means are respectively phototransistors.

* * * * *